United States Patent [19]
Gilbert et al.

[11] Patent Number: 6,002,264
[45] Date of Patent: Dec. 14, 1999

[54] INTERCONNECT ADAPTER TO PRINTED CIRCUIT ASSEMBLY FOR TESTING IN AN OPERATIONAL ENVIRONMENT

[75] Inventors: Mark L. Gilbert, Auburn; Robert J. Wharton, Rocklin, both of Calif.

[73] Assignee: Hewlett-Packard Company, Palo Alto, Calif.

[21] Appl. No.: 08/914,829

[22] Filed: Aug. 19, 1997

[51] Int. Cl.⁶ .................................................. G01R 31/02
[52] U.S. Cl. .......................................... 324/755; 324/754
[58] Field of Search ..................................... 324/754, 755, 324/750, 761, 765, 72.5

[56] References Cited

U.S. PATENT DOCUMENTS

| | | | |
|---|---|---|---|
| 3,970,934 | 7/1976 | Aksu | 324/761 |
| 4,724,383 | 2/1988 | Hart | 361/754 |
| 4,771,234 | 9/1988 | Cook et al. | 324/754 |
| 5,055,779 | 10/1991 | Kerschner et al. | 324/754 |
| 5,200,694 | 4/1993 | Nesbitt et al. | 324/754 |
| 5,550,481 | 8/1996 | Holmes et al. | |
| 5,603,619 | 2/1997 | Turner et al. | |
| 5,633,597 | 5/1997 | Stowers et al. | 324/761 |

OTHER PUBLICATIONS

Emulation Technology, Inc. Catalog, , available from Emulation Technology, Inc., 344 Walsh Avenue, Bldg F. Santa Clara, CA 95051, 1996, pp. 4, 15, 17, 19, 39, 101, 105.

*Primary Examiner*—Ernest Karlsen
*Assistant Examiner*—Minh Tang

[57] ABSTRACT

An interconnect adapter is used in operational environment testing of a printed circuit assembly unit. The interconnect adapter includes a main base assembly, a probe plate assembly and an engagement unit. The main base assembly includes an attachment structure for attaching the printed circuit assembly unit to the main base assembly. The printed circuit assembly unit, when attached to the main base assembly, is in position to be connected to a host device. The probe plate assembly is attached to the main base assembly and includes pins for electrical connection to test points for an integrated circuit on the printed circuit assembly unit. The engagement unit is for engaging the pins of the probe plate assembly in position to make electrical connection with the test points.

17 Claims, 4 Drawing Sheets

INTERCONNECT ADAPTER TO PRINTED CIRCUIT ASSEMBLY FOR TESTING IN AN OPERATIONAL ENVIRONMENT

BACKGROUND

The present invention concerns testing of printed circuit assemblies and pertains particularly to an interconnect adapter to a printed circuit assembly used for performing testing in an operational environment.

When producing printed circuit assembly (PCA) units, such as network interface products, some portion of the PCA units that are built inevitably do not function as desired. Often defective PCA units can be detected when tested as part of an assembly line. In some cases, however, some PCA units are best tested in an "operational environment" that is, the PCA units need to be attached to a host device and exercised in a manner as the PCA units are intended to be used.

When tested in an operational environment, the PCA unit is attached to the host device. The microprocessor which controls the PCA is typically disabled and an emulator is used during the testing. The emulator is typically attached using test clip adapters. These test clip adapters are available for fine and extra-fine pitch surface mount components.

There are several disadvantages to using the currently available conventional test clip adapters for operational testing. For example, the test clip adapters that are available for large ASICs are difficult to attach properly and are easily dislodged. In addition, the pins of the test clip adapters can get bent such that they do not make reliable connections. Also it is possible to install the test clip adapters in a wrong orientation thus resulting in incorrect connections. Additionally, existing test clip adapters are expensive.

Additionally, while conventional test clip adapters, despite their disadvantages, are functional for connection to typical ASIC packages which utilize lead frames around the peripheral of the package for connection, they cannot be used with packaging technologies such as ball-grid arrays (BGAs) which use solder balls under the ASIC package for electrical connections to a printed circuit board (PCB).

SUMMARY OF THE INVENTION

In accordance with the preferred embodiment of the present invention, an interconnect adapter is used in operational environment testing of a printed circuit assembly unit. The interconnect adapter includes a main base assembly, a probe plate assembly and an engagement unit.

The main base assembly includes attachment means for attaching the printed circuit assembly unit to the main base assembly. The printed circuit assembly unit, when attached to the main base assembly, is in position to be connected to a host device. The probe plate assembly is attached to the main base assembly and includes pins for electrical connection to test points electrically connected to an integrated circuit on the printed circuit assembly unit. The engagement unit is for engaging the pins of the probe plate assembly in position to make electrical connection with the test points which are on the printed circuit assembly unit.

In the preferred embodiment, the engagement unit includes two cam plates. The cam plates, when slid in a first position with respect to the main base assembly, cause the probe plate assembly to be lifted which results in the pins of the probe plate assembly being placed in position to make electrical connection with the test points on the printed circuit assembly unit. When the two cam plates are slid in a second position with respect to the main base assembly, the probe plate assembly is lowered and the pins of the probe plate assembly which make electrical connection are disengaged from the test points electrically connected to the integrated circuit on the printed circuit assembly unit.

Also in the preferred embodiment, the probe plate assembly includes a connector for electrical connection to an emulator printed circuit assembly and includes connectors for the attachment of logic analyzer paddles of a logic analyzer.

Also in the preferred embodiment, the printed circuit assembly unit is attached to the main base assembly using a plurality of snap fingers which snap over edges of the printed circuit assembly unit. In addition, alignment pins are used to assure proper alignment of the printed circuit assembly unit to the main base assembly.

Interconnect adapters in accordance with the present invention simplify the connection of a logic analyzer and an emulator to a PCA unit for operational environmental test. Further, when the PCA unit is in place on an interconnect adapter, the PCA unit still can be plugged into a host device, such as a host peripheral or can be plugged into an electronic test system. In either case, acceptably short bus lengths, on the order of three to five inches, can be maintained. The interconnect adapter also allows for the disabling and substitute emulation of a microprocessor embedded in an ASIC within the PCA unit. Additionally, the resulting interconnect adapter is small enough to be hand-held and does not require any additional mechanism or machinery to actuate. The interconnect adapter also allows for a large number of connections to be made quickly and with minimal operator actions. The interconnect adapter virtually eliminates incorrect electrical connections, yet is robust enough to withstand bumping or jarring without disturbing the connections. Further, the interconnect adapter may be manufactured for about half the cost of prior art test clip adapters.

DESCRIPTION OF THE PREFERRED EMBODIMENT

Figure 1:
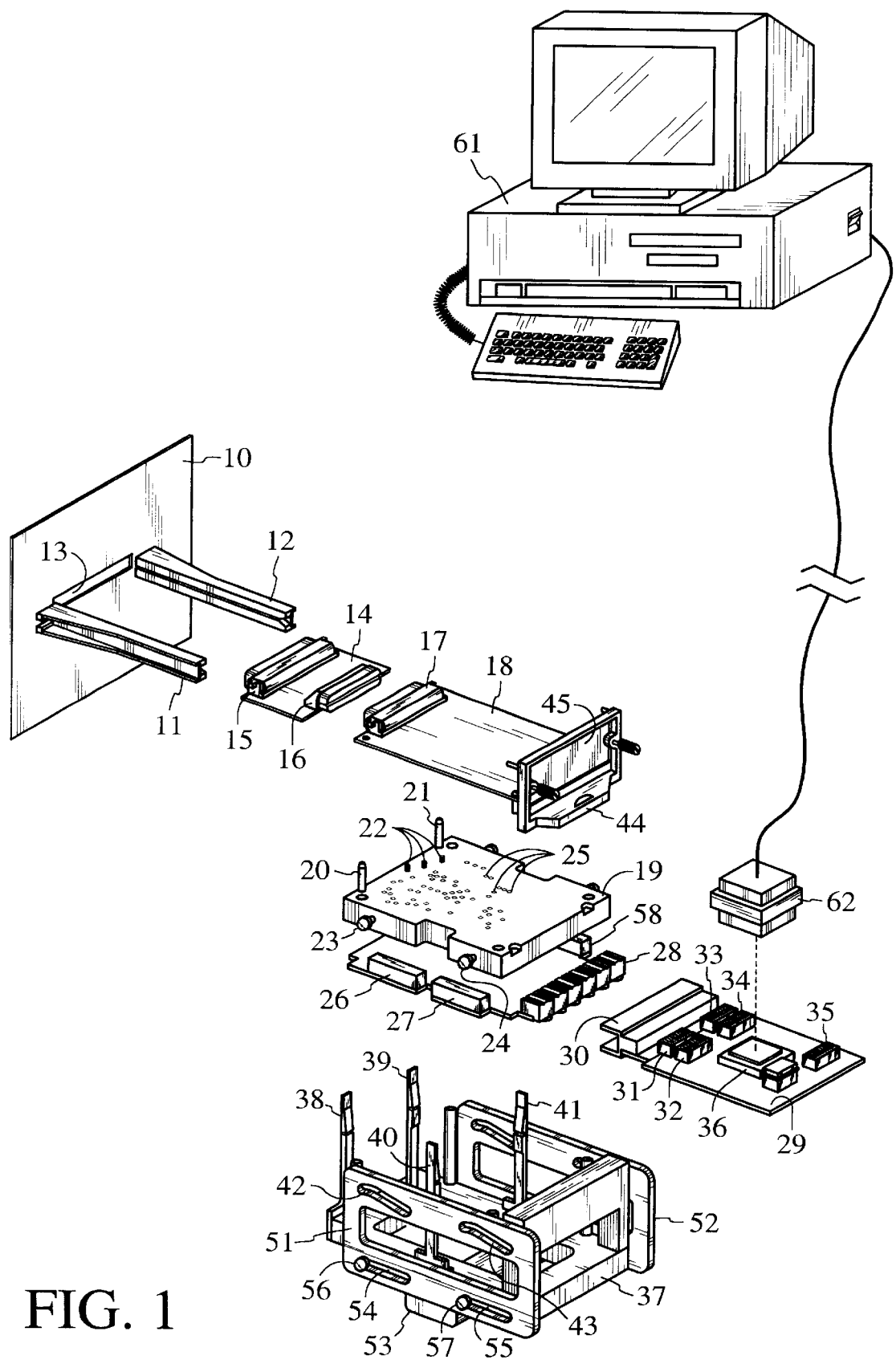
FIG. 1 is an expanded view of an interconnect adapter used for operational environment testing of a printed circuit assembly unit in accordance with the preferred embodiment of the present invention.

FIG. 1 is an expanded view of an interconnect adapter used for operational environment testing of a printed circuit assembly (PCA) unit 18. For example, PCA unit 18 is a network interface product. Alternatively, PCA unit 18 is any PCA which can be attached to a host device. The interconnect adapter includes a main base assembly 37 and a probe plate assembly 19. Attached to main base assembly 37 is a cam plate assembly which consists of a cam plate 51 and a cam plate 52 tied together by a handle 53 which extends across the bottom of main base assembly 37. Each cam plate includes four slots. For example, cam plate 51 is shown to include a slot 42, a slot 43, a slot 54 and a slot 55. Attached to main base assembly 37 are a snap finger 38, a snap finger 39, a snap finger 40 and a snap finger 41. A sliding shaft 56 attached to main base assembly 37 is shown placed through slot 54. Likewise, a shaft 57 attached to main base assembly 37 is shown placed through slot 55.

Probe plate assembly 19 includes four connectors for logic analyzer paddles of a logic analyzer. Shown in FIG. 1 are a connector 26, a connector 27 and a connector 58. A shaft 23, attached to probe plate assembly 19, is for placement through slot 42 of cam plate 51. Likewise, a shaft 24, attached to probe plate assembly 19, is for placement through slot 43 of cam plate 51.

On top of probe plate assembly 19 is an alignment pin 20 and an alignment pin 21. Through holes 25 in probe plate assembly 19 are placed spring pins. For example, shown in FIG. 1 are spring pins 22 inserted through a hole in probe plate assembly 19. A connector 28 is used to connect probe plate assembly 19 to an emulator printed circuit assembly (PCA) 29.

Emulator PCA 29 includes a connector 30, a DIP switch 31, a DIP switch 32, a DIP switch 33, a DIP switch 34 and a DIP switch 35. Alternatively DIP switches 31 through 34 can be replaced by electronic switches. Emulator PCA 29 also includes a square socket 36 into which is attached a connector 62 from a computer 61, on which may be run an emulator. The emulator emulates the processor on PCA unit 18. For example, PCA unit 18 includes a 68000 processor embedded within an ASIC and the emulator is a Motorola 68000 microprocessor emulator. Alternatively, PCA unit 18 could utilize any type of processor. The emulator on computer 61 is selected for compatibility with the processor utilized by PCA unit 18. PCA unit 18 includes a connector 17 used to connect PCA unit 18 to a host device 10. A face plate 45 of PCA unit 18 includes a bezel lip 44.

Host device 10 is, for example, a peripheral such as a printer or a scanner. Alternatively, host device 10 may be a test system or any device onto which is connected a PCA. Host device 10 includes a card guide 11 and a card guide 12. Connection is made to peripheral 10 through a connector slot 13. In the preferred embodiment a wear adapter PCA 14 is used during testing to prevent wear to the connector of peripheral 10. Wear adapter PCA 14 includes a connector 15, for attachment to peripheral 10, and a connector 16 for attachment to PCA unit 18. While wear adapter PCA 14 is used to limit wear on the connector of peripheral 10, the present invention operates the same when a wear adapter PCA is not used.

Figure 2:
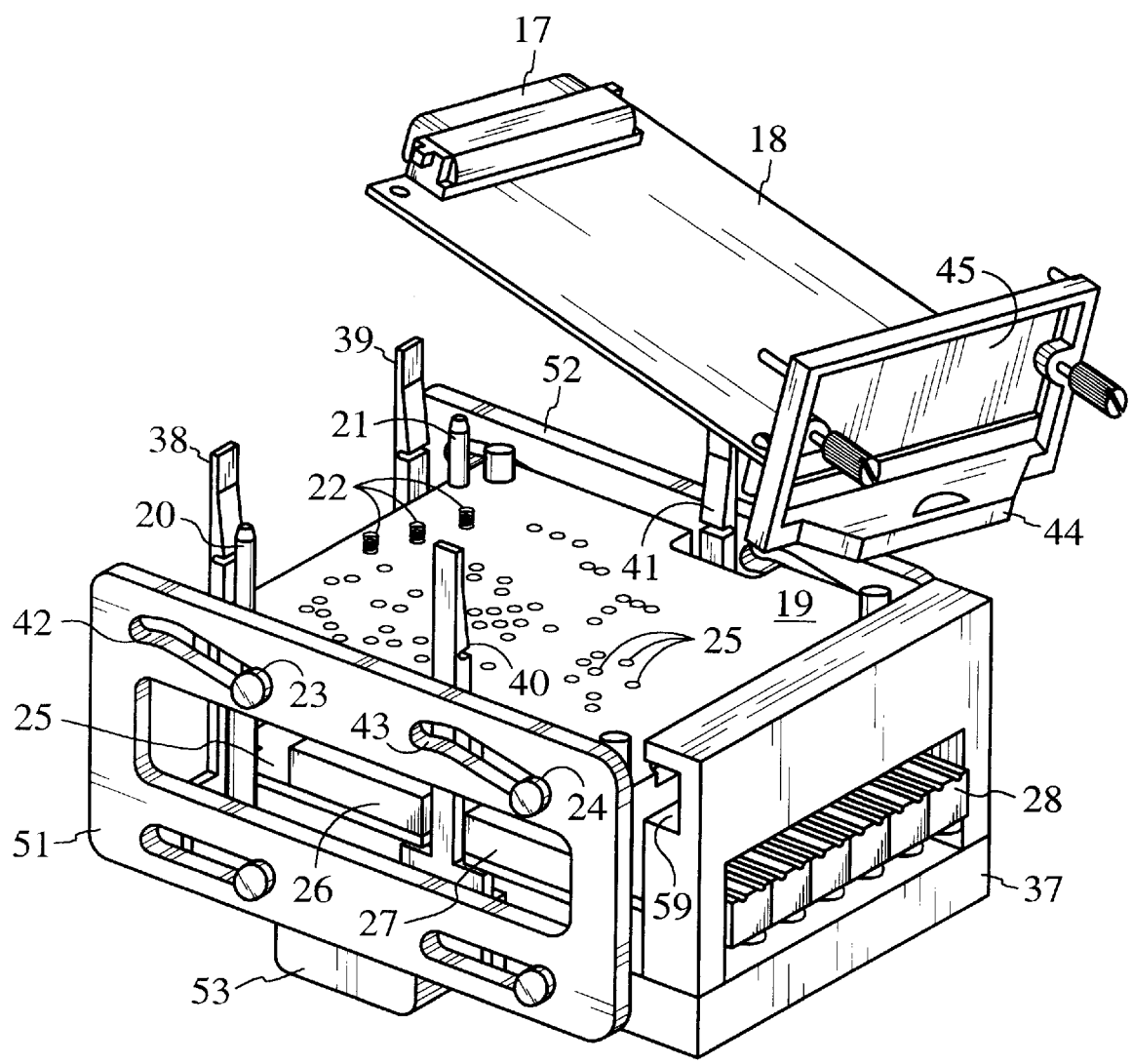
FIG. 2 shows how the printed circuit assembly unit and the interconnect adapter, shown in FIG. 1, may be connected together in accordance with the preferred embodiment of the present invention.

FIG. 2 shows probe plate assembly 19 being placed within main base assembly 37. Shaft 23, attached to probe plate assembly 19, is placed through slot 42 of cam plate 51. Likewise, shaft 24, attached to probe plate assembly 19, is placed through slot 43 of cam plate 51. In FIG. 2, cam plate 51 and cam plate 52 are in a leftmost position with regard to main base assembly. As a result, probe plate assembly 19 is in a lowered position.

In order to place PCA unit 18 in position for testing, bezel lip 44 of PCA unit 18 is placed within a shelf bracket 59 of main base assembly 37. PCA unit 18 is then rotated down over alignment pins 20 and 21 until snap fingers 38, 39, 40 and 41 latch over the edges of PCA unit 18.

Figure 3:
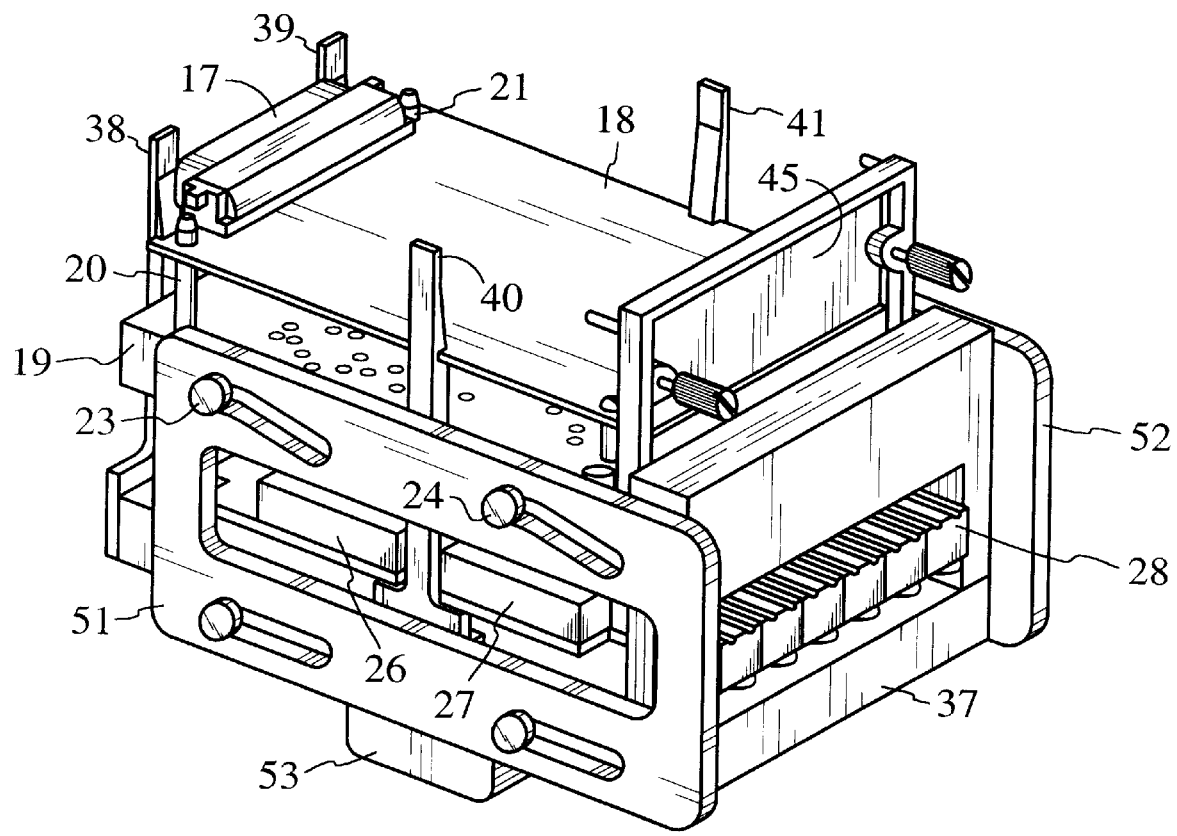
FIG. 3 shows the printed circuit assembly unit and the interconnect adapter, shown in FIGS. 1 and 2, connected together in accordance with the preferred embodiment of the present invention.

As shown by FIG. 3, once PCA unit 18 is in place, cam plate 51 and cam plate 52 can be slid over, using handle 53, to a rightmost position with respect to main base assembly 37. As a result, probe plate assembly 19 is raised and the spring pins on top of probe plate assembly 19 make electrical contact with test points on PCA unit 18. The test points are electrically connected to leads of the integrated circuit packages soldered to PCA unit 18. If ball-grid array integrated circuit packages are soldered to PCA unit 18, the spring pins on top of probe plate assembly 19 come in contact with test points electrically connected to the solder balls underneath the integrated circuit packages. The connections are used, for example, to disable a processor within an ASIC which controls PCA unit 18 and to provide control of PCA unit 18 from an emulator. The connections also, through the logic analyzer paddles, allow a logic analyzer access in order to analyze the electrical signals generated and received by PCA unit 18.

Figure 4:
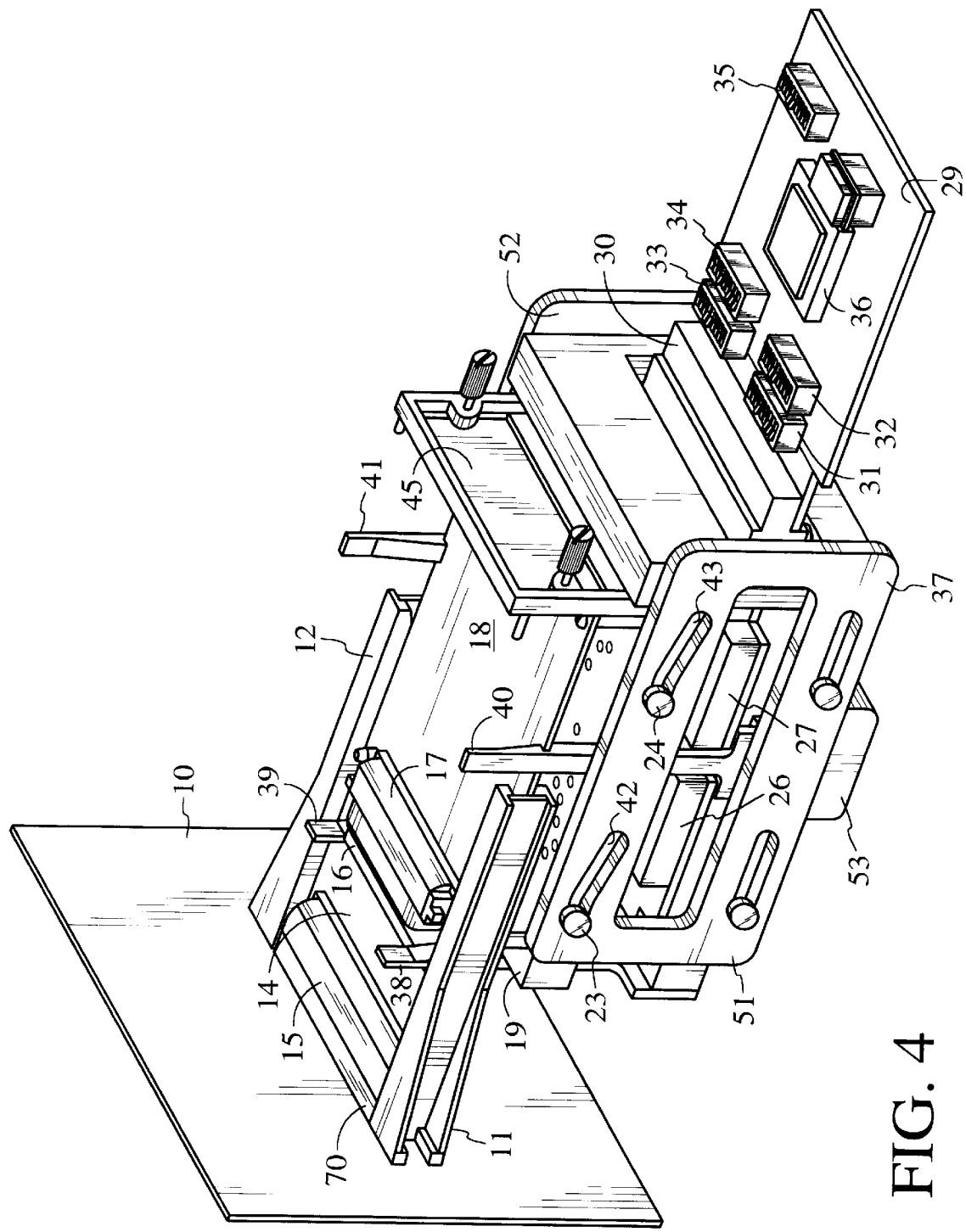
FIG. 4 show the printed circuit assembly unit and the interconnect adapter, shown in FIG. 3, connected together with the printed circuit assembly unit attached to a host device, and an emulator printed circuit assembly connected to the interconnect adapter, in accordance with the preferred embodiment of the present invention.

As shown by FIG. 4, once PCA unit 18 is in place and probe plate assembly 19 has been engaged by sliding cam plate 51 and cam plate 52 to the rightmost position with respect to main base assembly 37, PCA unit 18 can be attached to a connector 70 of peripheral 10 using wear adapter PCA 14. Emulator printed circuit assembly (PCA) 29 can then be attached to connector 28 (shown in FIG. 3) of probe plate assembly 19. As described above, connector 62 from computer 61 (shown in FIG. 1) can be connected to square socket 36 of emulator PCA 29 in order to allow an emulator running on computer 61 to control PCA unit 18 during testing. Additionally, a logic analyzer can monitor performance of PCA unit 18 when the logic analyzer is connected to one or more of the four logic analyzer paddle connectors (e.g., connectors 26 and 27 are shown in FIG. 4, FIG. 1 additionally shows connector 58) of probe plate assembly 19.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. An interconnect adapter for use in an operational environment testing of a printed circuit assembly unit, the interconnect adapter comprising:

a main base assembly, the main base assembly including attachment means for attaching the printed circuit assembly unit to the main base assembly, wherein the printed circuit assembly unit has a separate connector which, when the printed circuit assembly unit is attached to the main base assembly, is still in position to be connected to a host device, wherein the separate connector can be used under a normal operating (non-testing) configuration to connect the printed circuit assembly to the host device;

a probe plate assembly, attached to the main base assembly, including pins for electrical connection to test points for an integrated circuit on the printed circuit assembly unit; and, an engagement unit, connected to the probe plate assembly, for engaging the pins of the probe plate assembly in position to make electrical connection with the test points, wherein when the pins of the probe plate assembly are engaged in a position to make electrical connection with the test points, the pins do not make direct physical contact with the separate connector.

2. An interconnect adapter as in claim 1 wherein the engagement unit comprises two cam plates which when slid in a first position with respect to the main base assembly results in the pins of the probe plate assembly being placed in position to make electrical connection with the test point, and when slid in a second position with respect to the main base assembly disengages the pins of the probe plate assembly from making electrical connection with the test points.

3. An interconnect adapter as in claim 1 wherein the pins are spring pins.

4. An interconnect adapter as in claim 1 wherein the probe plate assembly additionally includes a connector for electrical connection to an emulator printed circuit assembly.

5. An interconnect adapter as in claim 1 wherein the probe plate assembly additionally includes a logic analyzer paddle connector for electrical connection to a logic analyzer.

6. An interconnect adapter as in claim 1 wherein the attachment means includes a plurality of snap fingers which snap over edges of the printed circuit assembly unit.

7. An interconnect adapter as in claim 6 wherein the attachment means additionally includes a plurality of alignment pins.

8. An interconnect adapter as in claim 1 wherein the host device is a network interface product.

9. An interconnect adapter as in claim 1 wherein the printed circuit assembly unit is a computer peripheral.

10. A method for use in operational environment testing of a printed circuit assembly unit, the method comprising the steps of:

(a) attaching the printed circuit assembly unit to a main base assembly so that the printed circuit assembly unit, when attached to the main base assembly, is in position to be connected to a host device;

(b) engaging pins of a probe plate assembly to test points for an integrated circuit on the printed circuit assembly unit; and, (c) connecting the printed circuit assembly unit to a host device, the printed circuit assembly unit being connected to the host device via a connector that is part of the printed circuit assembly, wherein when the pins of the probe plate assembly are engaged to the test points, the pins do not make direct physical contact with the connector.

11. A method as in claim 10 wherein step (b) includes sliding two cam plates in a first position with respect to the main base assembly so that the pins of the probe plate assembly are placed in position to make electrical connection with test points.

12. A method as in claim 10 wherein in step (b) the pins are spring pins.

13. A method as in claim 10 additionally comprising the following step:

(d) connecting the probe plate assembly to an emulator printed circuit assembly.

14. A method as in claim 10 additionally comprising the following step:

(d) connecting a logic analyzer to logic analyzer paddle connectors on the probe plate assembly.

15. A method as in claim 10 wherein step (a) includes snapping a plurality of snap fingers over edges of the printed circuit assembly unit.

16. A method as in claim 10 wherein in step (c) the host device is a network interface product.

17. A method as in claim 10 wherein in step (c) the printed circuit assembly unit is a computer peripheral.

* * * * *